United States Patent
Suzuki et al.

(10) Patent No.: US 11,863,125 B2
(45) Date of Patent: Jan. 2, 2024

(54) TERAHERTZ OSCILLATOR AND PRODUCING METHOD THEREOF

(71) Applicant: TOKYO INSTITUTE OF TECHNOLOGY, Tokyo (JP)

(72) Inventors: Safumi Suzuki, Tokyo (JP); Van Ta Mai, Tokyo (JP); Yusei Suzuki, Tokyo (JP); Masahiro Asada, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 17/794,503

(22) PCT Filed: Jan. 5, 2021

(86) PCT No.: PCT/JP2021/000069
§ 371 (c)(1),
(2) Date: Jul. 21, 2022

(87) PCT Pub. No.: WO2021/171787
PCT Pub. Date: Sep. 2, 2021

(65) Prior Publication Data
US 2023/0057209 A1    Feb. 23, 2023

(30) Foreign Application Priority Data
Feb. 26, 2020   (JP) .................... 2020-030428

(51) Int. Cl.
*H03B 7/08*    (2006.01)
*H01L 21/306*  (2006.01)
(Continued)

(52) U.S. Cl.
CPC ......... *H03B 7/08* (2013.01); *H01L 21/30604* (2013.01); *H01L 27/0605* (2013.01);
(Continued)

(58) Field of Classification Search
CPC ............ H01L 27/0676; H01L 27/0605; H01L 29/882; H01L 29/66083; H01L 21/30604; H03B 7/08
(Continued)

(56) References Cited

U.S. PATENT DOCUMENTS 9,197,156 B2 * 11/2015 Sekiguchi ................ H03B 7/14
2014/0292428 A1 * 10/2014 Koyama .................. H03B 7/14
331/107 T

FOREIGN PATENT DOCUMENTS

| JP | 2006-210585 | 8/2006 |
| JP | 2013-171966 | 9/2013 |

(Continued)

OTHER PUBLICATIONS

International Search Report dated Mar. 16, 2021 in corresponding International Application No. PCT/JP2021/000069.
(Continued)

*Primary Examiner* — Arnold M Kinkead
(74) *Attorney, Agent, or Firm* — Wenderoth, Lind & Ponack, L.L.P.

(57) ABSTRACT

An object of the present invention is to provide a terahertz oscillator that does not have an MIM capacitor structure of which producing is intricacy, and oscillates due to resonance of an RTD and stabilizing resistors. The present invention is a terahertz oscillator, wherein a slot antenna having a slot is formed between a first electrode plate and a second electrode plate which are applied a bias voltage, stabilizing resistors to respectively connect to the first electrode plate and the second electrode plate are provided in the slot, an RTD is provided on the second electrode plate through a mesa, and a conductive material member to form an air bridge between the first electrode plate and the mesa is provided, and wherein an oscillation in a terahertz frequency band is
(Continued)

obtained due to a resonance of the RTD and the stabilizing resistors.

10 Claims, 14 Drawing Sheets

(51) Int. Cl.
  *H01L 29/66* (2006.01)
  *H01L 29/88* (2006.01)
  *H01L 27/06* (2006.01)

(52) U.S. Cl.
  CPC .... *H01L 27/0676* (2013.01); *H01L 29/66083* (2013.01); *H01L 29/882* (2013.01)

(58) Field of Classification Search
  USPC ..................................................... 331/107 T
  See application file for complete search history.

(56) References Cited

FOREIGN PATENT DOCUMENTS

| | | |
|---|---|---|
| JP | 2015-180049 | 10/2015 |
| JP | 2016-111542 | 6/2016 |
| JP | 6570187 | 9/2019 |
| WO | 2015/170425 | 11/2015 |

OTHER PUBLICATIONS

M. Asada, S. Suzuki, and N. Kishimoto, "Resonant Tunneling Diodes for Sub-Terahertz and Terahertz Oscillators", Japanese Journal of Applied Physics, vol. 47, No. 6, pp. 4375-4384, Jun. 2008.

M. Asada and S. Suzuki, "Room-Temperature Oscillation of Resonant Tunneling Diodes close to 2 THz and Their Functions for Various Applications", Journal of Infrared, Millimeter, and Terahertz Waves, vol. 37, pp. 1185-1198, Oct. 2016.

\* cited by examiner

PRIOR ART

PRIOR ART

PRIOR ART

FIG.7A
FIG.7B
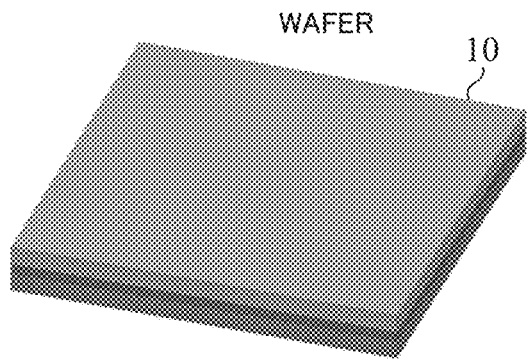
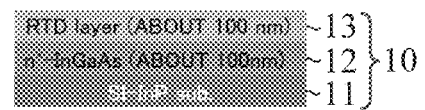
PRIOR ART
FIG.8A
FIG.8B
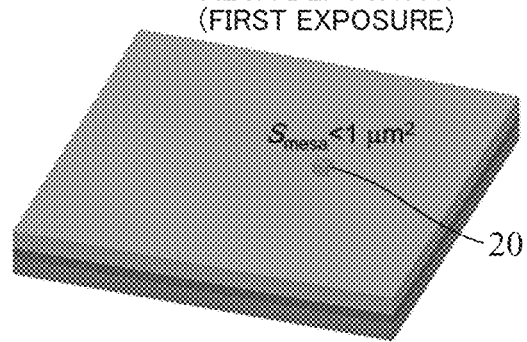
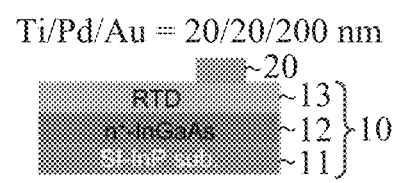
PRIOR ART

MESA FORMATION

ANTENNA & DEPOSITION OF LOWER ELECTRODE
(SECOND EXPOSURE)

PRIOR ART

PRIOR ART

FIG.13A
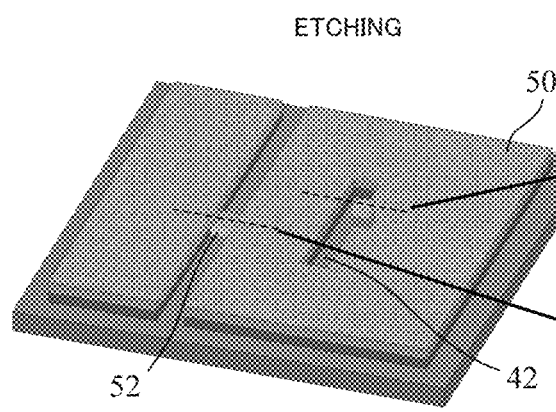
ETCHING
FIG.13B
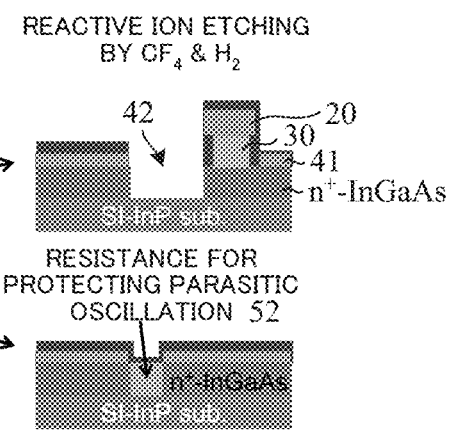
REACTIVE ION ETCHING BY $CF_4$ & $H_2$
RESISTANCE FOR PROTECTING PARASITIC OSCILLATION 52
FIG.13C
PRIOR ART
FIG.14A
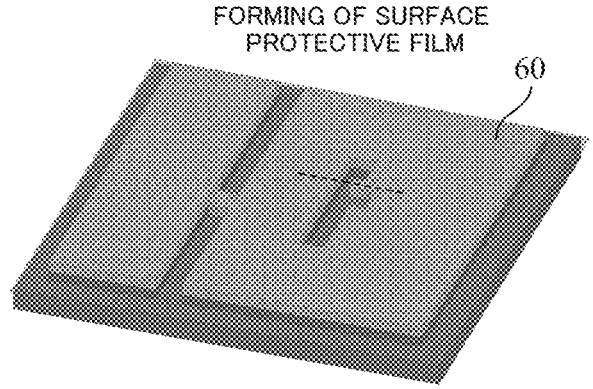
FORMING OF SURFACE PROTECTIVE FILM
FIG.14B
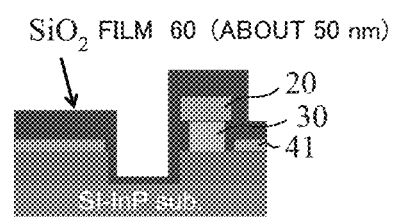
$SiO_2$ FILM 60 (ABOUT 50 nm)
PRIOR ART FIG.15A
FORMATION WITH RESIST
MASK HAVING OPENING
(FOURTH EXPOSURE)
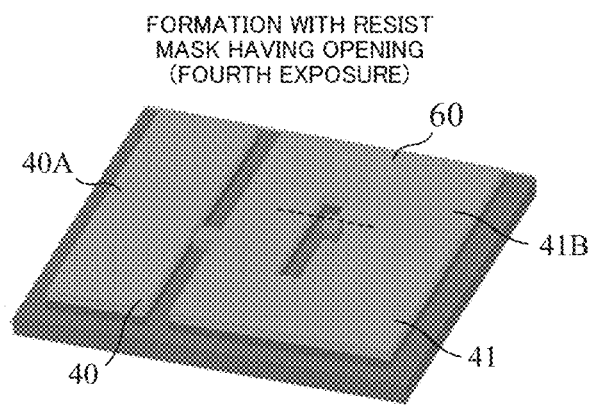
FIG.15B
REACTIVE ION
ETCHING BY $CF_4$
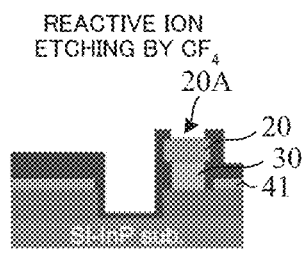
PRIOR ART
FIG.16A
AIR BRIDGE & MIM FORMATION
(FIFTH & SIXTH EXPOSURES)
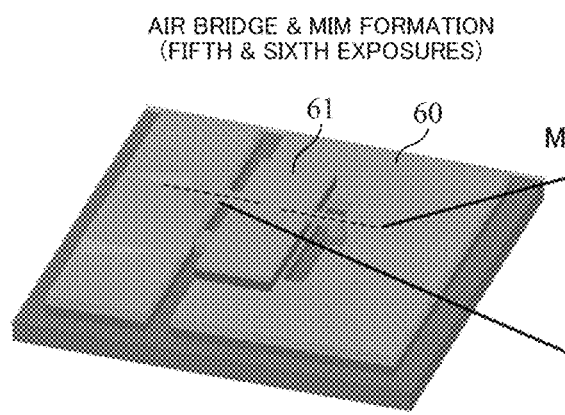
FIG.16B
Cr/Au = 10/ ABOUT 1500 nm
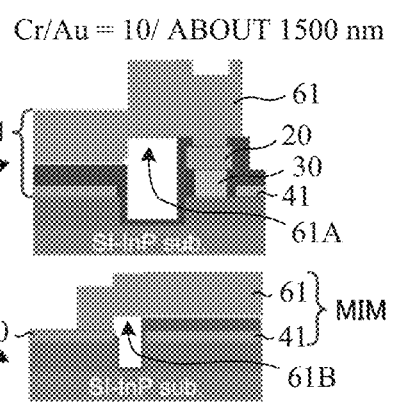
FIG.16C
PRIOR ART

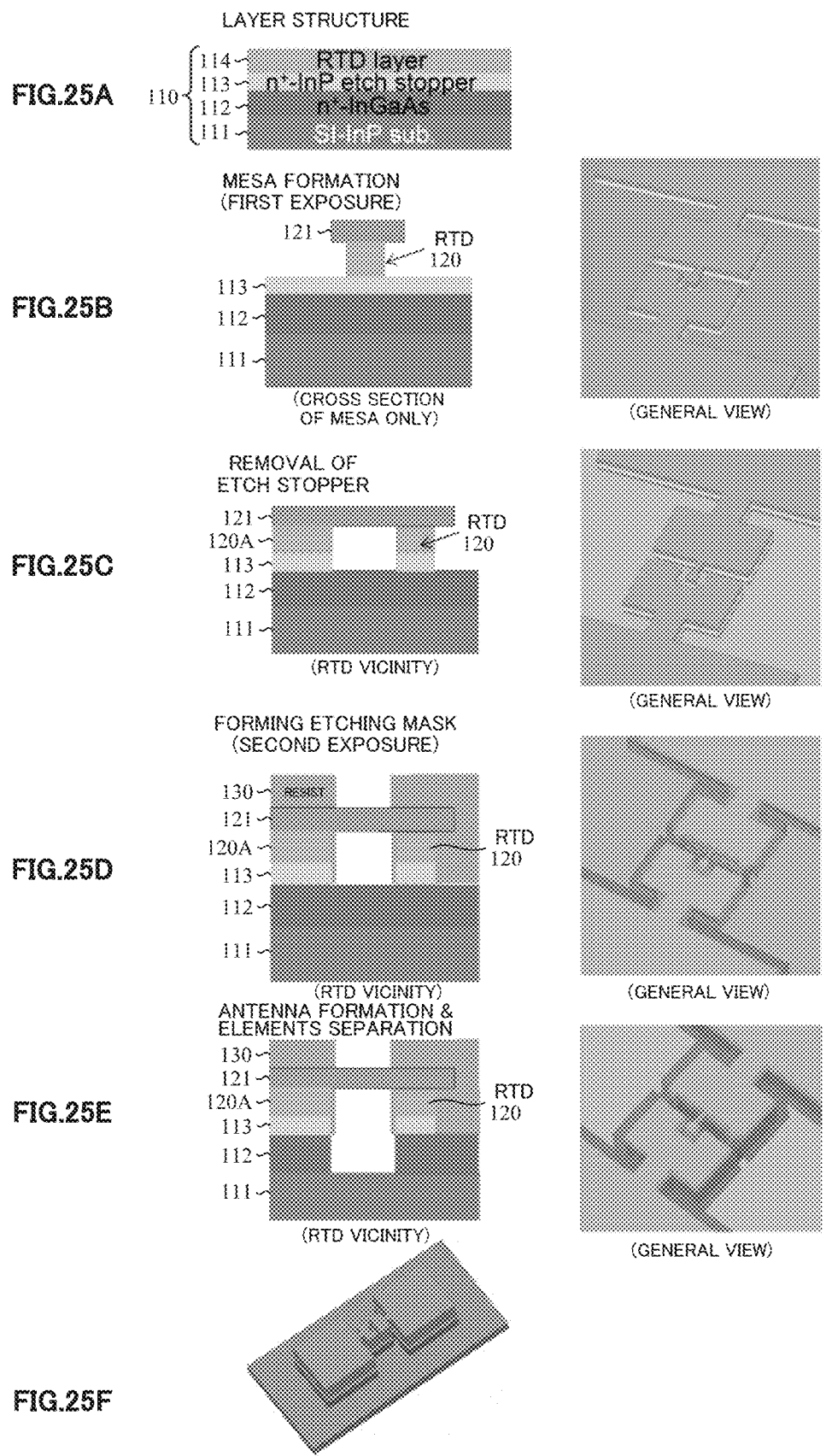

FIG.26A  FIG.26B
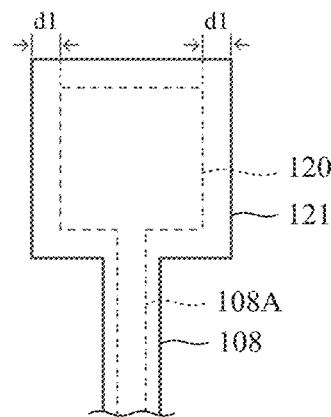
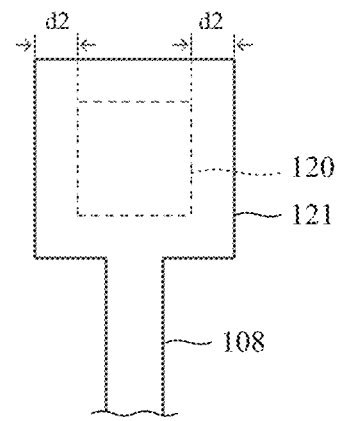
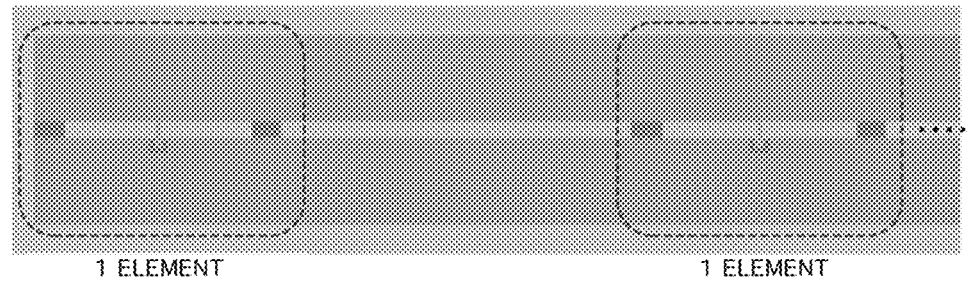
FIG.27A
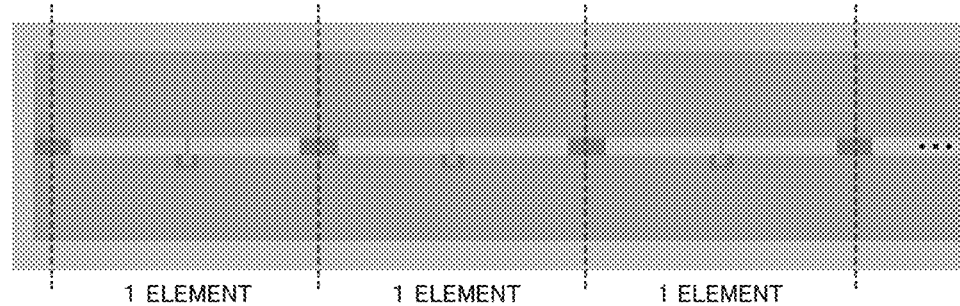
FIG.27B

TERAHERTZ OSCILLATOR AND PRODUCING METHOD THEREOF

TECHNICAL FIELD

The present invention relates to a terahertz oscillator that oscillates waves whose frequency is in a terahertz frequency (THz) band locating in intermediate between radio waves and light waves and to a producing method thereof, and in particular, to a simple type terahertz oscillator that has no Metal Insulator Metal (MIM) capacitor structure, the production is easy, and uses a resonance of a double barrier type resonant tunneling diode (RTD) and stabilizing resistors and to a producing method thereof.

BACKGROUND ART

A terahertz (THz) frequency band which is in a range of about 0.1 [THz] to about 10 [THz] locating in intermediate between radio waves and light waves, is an undeveloped frequency band. If a device which oscillates waves in the terahertz (THz) frequency band is put to a practical use, the terahertz oscillator is expected to be applied to various fields such as imaging technology and high-speed communications. For the above use, it is indispensable to develop the small-size terahertz oscillator. As one example, the terahertz oscillator using a double barrier type resonant tunneling diode (RTD) device having semiconductor nanostructures have been studied. Currently, this terahertz oscillator is an only electronic device which enables to oscillate the waves whose frequency is in a range of 1 [THz] to 2 [THz] at the room temperature even by itself. However, there are problems that the output of this terahertz oscillator is about 10 [μW] and is very low power, and the production is intricacy and complicated.

FIG. 1 shows a conventional terahertz oscillator, a lower electrode 4 is stacked on an indiumphosphide (hereinafter, referred to as "InP") substrate 3 whose shape is a square having about 1 [mm] length, and a slot antenna 2 whose configuration is a rectangular recess (the dimension is about 10 to 20 [μm]) is disposed at the substantially center portion of the lower electrode 4. Further, anupper electrode 5 and stabilizing resistors (resistance value Rs) 6 are also disposed on the InP substrate 3, and the resonant tunneling diode (RTD) 1, which has a negative voltage-current (V-I) characteristics as shown in FIG. 3, is disposed at a tip portion of the upper electrode 5 via a MIM (Metal Insulator Metal) capacitor 7. The stabilizing resistors 6 are connected between the lower electrode 4 and the upper electrode 5 for stabilizing the oscillation operation, and the stabilizing resistors 6 comprise, for example, indium gallium arsenide (InGaAs) sheets. The upper electrode 5 is grounded, and a DC bias (bias voltage Vb) is applied to the lower electrode 4. When the bias voltage Vb by the DC bias is applied to the resonant tunneling diode (RTD) 1, an electron is tunneling through a quantum level of a quantum well and a tunnel current is flowed. In a case that the applied bias voltage Vb further increases, since the electron cannot be tunneling and the current decreases when the quantum level in the quantum well is lower than a bottom of a conduction band of an emitter, the V-I characteristics shown in FIG. 3 are obtained. By using the negative differential resistance characteristics "−$G_{RTD}$" in which the current decreases, the electromagnetic wave can be oscillated and be amplified. Further, the resonant tunneling diode (RTD) 1 has the negative differential resistance "−$G_{RTD}$" and a parasitic capacitance "$G_{RTD}$" in parallel, and the electromagnetic wave is radiated in a vertical direction to a standing wave of an electric field as shown in FIG. 2. The output is defined by the radiation resistance of the slot antenna 2.

As described above, the conventional terahertz oscillator is the resonant structure of the RTD 1 and the MIM 7, and the slot antenna 2 is formed by the MIM capacitance $C_{MIM}$ in which the MIM 7 has and RTD 1. Because the slot antenna 2 is represented by an LC-resonant circuit and a radiation loss "$G_{ant}$", an equivalent circuit of this oscillator is indicated by the equivalent circuit shown in FIG. 4. A condition required for the oscillation start is a case that the positive value "$G_{RTD}$" of the negative differential resistance characteristics becomes the radiation loss "$G_{ant}$" or more, as shown in a following Expression 1, and the oscillation frequency "$f_{OSC}$" is represented by a following Expression 2.

$$G_{RTD} \geq G_{ant} \quad \text{[Expression 1]}$$

$$f_{OSC} = \frac{1}{2\pi\sqrt{L_s(C_s + C_{RTD})}} \quad \text{[Expression 2]}$$

Further, the equivalent circuit of the oscillator including the bias circuit (the bias voltage Vb) is shown in FIG. 5, the MIM capacitance $C_{MIM}$ of the MIM capacitor 7 and the resistance $R_S$ of the stabilizing resistors 6 are connected in parallel, there exists an inductance $L_S$ of the slot antenna 2 between the RTD 1 and the MIM capacitance $C_{MIM}$, and further there exists the inductance $L_W$ of the line between the bias circuit and the resistance value $R_S$. An orbital current "i" flows in and around the slot antenna 2 as shown in FIG. 1, and the inductance $L_S$ due to the orbital current "i" is generated. In the equivalent circuit of FIG. 5, since the inductance $L_W$ is released due to a short circulation of the MIM capacitance $C_{MIM}$ in the high frequency band, the resonant circuit of the RTD 1 and the inductance $L_S$ is formed as shown in FIG. 6A. Further, since the inductances $L_S$ and $L_W$ are ignored in the low frequency band and the resistance value $R_S$ cancels the NDR (the negative differential resistance) of the RTD 1, the resonant circuit is formed by the RTD 1, the bias voltage Vb and the resistance value $R_S$ of the stabilizing resistors 6 as shown in FIG. 6B.

The List of Prior Art Documents

Patent Documents

Patent Document 1: Japanese Unexamined Patent Publication No. 2013-171966 A
Patent Document 2: Japanese Unexamined Patent Publication No. 2006-210585 A
Patent Document 3: WO 2015/170425 A1
Patent Document 4: Japanese Patent No. 6570187 B2

Non-Patent Documents

Non-Patent Document 1: M. Asada, S. Suzuki, and N. Kishimoto,
"Resonant tunneling diodes for sub-terahertz and terahertz oscillators", Japanese Journal of Applied Physics, vol. 47, no. 6, pp. 4375-4384, 2008.
Non-Patent Document 2: M. Asada and S. Suzuki, "Room-temperature oscillation of resonant tunneling diodes close to 2 THz and their functions for various applications", Journal of Infrared, Millimeter, and Terahertz Waves, vol. 37, pp. 1185-1198, 2016.

SUMMARY OF THE INVENTION

Problems to be Solved by the Invention

The terahertz oscillator described above is generally produced by the following steps.

First, a wafer 10 of three-layer structure (an RTD layer 13, an n$^+$-InGAAs layer 12 and a Sl-InP substrate 11) as shown in FIGS. 7A and 7B is prepared, and an mesa 20 of which mesa area (square measure of the upper surface) $S_{mesa}$ is smaller than 1 [μm$^2$] as shown in FIGS. 8A and 8B, is deposited on the top layer surface of the wafer 10 by using a resist pattern. The mesa 20 is a three-layer structure which is Ti (20 [nm]), Pd (20 [nm]) and Au (200 [nm]) from the bottom layer. The formation of the above mesa 20 is the first exposure.

Next, an RTD mesa 30 of which height is about 150 [nm] is formed by a wet etching based on "H$_2$SO$_4$:H$_2$O$_2$:H$_2$O=1:1:40" at about 4 degrees Celsius as shown in FIGS. 9A and 9B. Then, a lower electrode 41 and a part 40 of an upper electrode are deposited by using a resist pattern as shown in FIGS. 10A and 20B, and the slot antenna 42 is formed. Since n$^+$-InGaAs layer 12 being under the RTD layer 13 is also cut by 50 [mm], the height of the RTD mesa 30 becomes about 150 [nm]. This is the second exposure. As well, both the lower electrode 41 and the part 40 of the upper electrode are four layers which are Ti (20 [nm]), Pd (20 [nm]), Au (50 [nm]) and Ti (5 [nm]) from the bottom.

The film 50 (about 50 [nm]) of SiO$_2$ is layered on a whole surface by using the chemical vapor deposition method as shown in FIGS. 11A and 11B. Further, a mask for reactive ion etching for forming the slot antenna 42 and a stabilizing resistor 52 by the reactive ion etching with CF 4 is formed as shown in FIGS. 12A and 12B by using a resist pattern to mask the parts except for the stabilizing resistor 52 and the slot antenna 42 for preventing the parasitic oscillation. This is the third exposure.

Thereafter, the bottom of the slot antenna 42 is deepened by removing the n$^+$-InGaAs layer 12 of the substrate by the reactive ion etching with CH$_4$ and H$_2$ as shown in FIGS. 13A and 13B. Subsequently, a part of the n$^+$-InGaAs layer 12 is converted into the stabilizing resistor 52 by the above reactive ion etching using the SiO$_2$ film 50 as the mask as shown in FIGS. 13A and 13C. Further, surface protective films are formed by layering the SiO$_2$ film 60 being thickness about 50 [nm] on the whole surface as shown in FIGS. 14A and 14B. Then, the protective films 60 at the three positions are removed by the reactive ion etching with the CF$_4$ by using the register mask having three openings as shown in FIGS. 15A and 15B. That is, the above three positions are a square shape upper portion 20A of the mesa 20, a square shape portion 40A of the upper electrode 40 and a square shape portion 41A of the lower electrode 41, and the part portions 40A and 41A may be suitable position.

Finally, the conductive material member of Cr/Au (about 1500 [nm]) becoming to the upper electrode to form the air bridge 61A straddling the RTD mesa 30 and the slot antenna 42 is deposited by using the three-layer resist as shown in FIGS. 16A and 16B. Then, the MIM capacitor is formed between the conductive material member and the lower electrode 41. The conductive material member of Cr/Au (about 1500 [nm]) to form the air bridge 61B straddling the part 40 of the upper electrode and the MIM is deposited as shown in FIGS. 16A and 16C. These are the fifth and sixth exposures.

As described above, since the conventional terahertz oscillator includes the MIM capacitor, the structure is complicated, the producing steps are many and intricacy, and especially the exposure for the patterning are necessary six times too.

The present invention has been developed in view of the above-described circumstances, and an object of the present invention is to provide a terahertz oscillator that has no MIM structure which is complicated and intricacy, and oscillates due to resonance of an RTD and stabilizing resistors.

Means for Solving the Problems

The present invention relates to a terahertz oscillator, and the above-described object of the present invention is achieved by the terahertz oscillator, wherein a slot antenna having a slot is formed between a first electrode plate and a second electrode plate which are applied a bias voltage, stabilizing resistors to respectively connect to the first electrode plate and the second electrode plate are provided in the slot, a resonant tunneling diode (RTD) is provided on the second electrode plate through a mesa, and a conductive material member to form an air bridge between the first electrode plate and the mesa is provided, and wherein an oscillation in a terahertz frequency band is obtained due to a resonance of the RTD and the stabilizing resistors.

Further, the present invention relates to a producing method of a terahertz oscillator, and the above-described object of the present invention is achieved by comprising steps of: preparing a substrate structure having four layers including a resonant tunneling diode (RTD) layer of a top layer, an etch stopper layer of a next layer and an n$^+$-InGaAs layer, forming a mesa at an RTD portion on the RTD layer by a first exposure, forming an RTD by removing the RTD layer by a first wet etching, forming an air bridge and stabilizing resistors by removing an etch stopper of the etch stopper layer by a second wet etching, layering photoresist on whole surface, forming a slot antenna by performing a second exposure by using a photomask, removing the photoresist and the n$^+$-InGaAs layer by a third wet etching and producing a terahertz oscillator to oscillate due to a resonance of the RTD and the stabilizing resistors.

Effects of the Invention

The terahertz oscillator according to the present invention does not have an MIM (conductive material)/insulator/metal (conductive material) structure, and obtains the oscillation in the terahertz frequency band due to the resonance of the double barrier type resonant tunneling diode (RTD) and the stabilizing resistors. In this connection, the structure is simple, and the steps of the producing process are able to significantly reduce than the conventional steps. Since the producing steps are few and the production is easy, it is possible to improve the yield of the products and number of trial.

BRIEF DESCRIPTION OF THE DRAWINGS

In the accompanying drawings:

FIGS. 7A and 7B are a perspective diagram and a sectional structure diagram showing a part of producing processes of the conventional terahertz oscillator using the resonant tunneling diode, respectively;

FIGS. 8A and 8B are a perspective diagram and a sectional structure diagram showing a part of the producing processes of the conventional terahertz oscillator using the resonant tunneling diode, respectively;

FIGS. 13A to 13C are a perspective diagram and a sectional structure diagram showing a part of the producing processes of the conventional terahertz oscillator using the resonant tunneling diode, respectively;

FIGS. 14A and 14B are a perspective diagram and a sectional structure diagram showing a part of the producing processes of the conventional terahertz oscillator using the resonant tunneling diode, respectively;

FIGS. 15A and 15B are a perspective diagram and a sectional structure diagram showing a part of the producing processes of the conventional terahertz oscillator using the resonant tunneling diode, respectively;

FIGS. 16A to 16C are a perspective diagram and a sectional structure diagram showing a part of the producing processes of the conventional terahertz oscillator using the resonant tunneling diode, respectively;

FIGS. 25A to 25F are perspective diagrams and sectional structure diagrams showing producing processes of the terahertz oscillator according to the present invention;

FIGS. 26A and 26B are plane views explaining the etch stopper removing (forming of the air bridge); and FIGS. 27A and 27B are array structure views showing expansion examples to large scale array of the present invention.

MODE FOR CARRYING OUT THE INVENTION

The present invention is a terahertz oscillator using a double barrier type resonant tunneling diode (RTD) and is a structure having no an MIM (Metal Insulator Metal) capacitor structure constituted by "metal (conductive material)/insulator/metal (conductive material)". Since there is no provided the MIM capacitor structure, the structure is simple, and the steps of the producing process can be significantly reduced than the conventional producing steps. Further, since it is possible to obtain the oscillation in the terahertz frequency band due to the resonance of the RTD and the stabilizing resistors, it is especially desired to the application for an imaging field, a high speed communication and so on.

Embodiments of the present invention will be described with reference to the accompanying drawings as follows.

Figure 1:
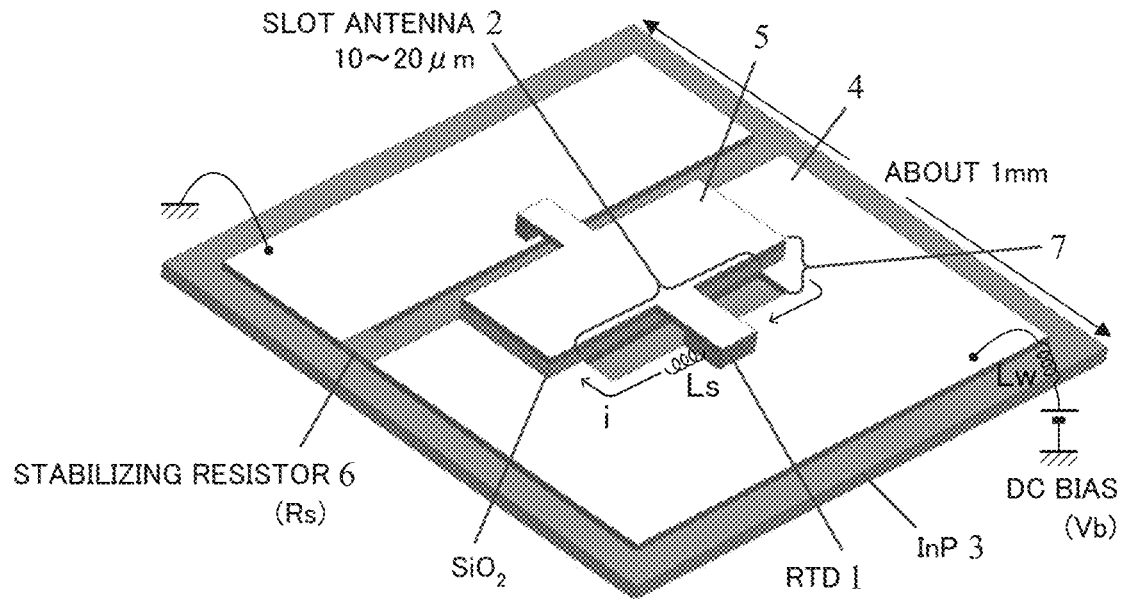
FIG. 1 is a perspective structure diagram showing one example of a conventional terahertz oscillator using a resonant tunneling diode (RTD)
Figure 2:
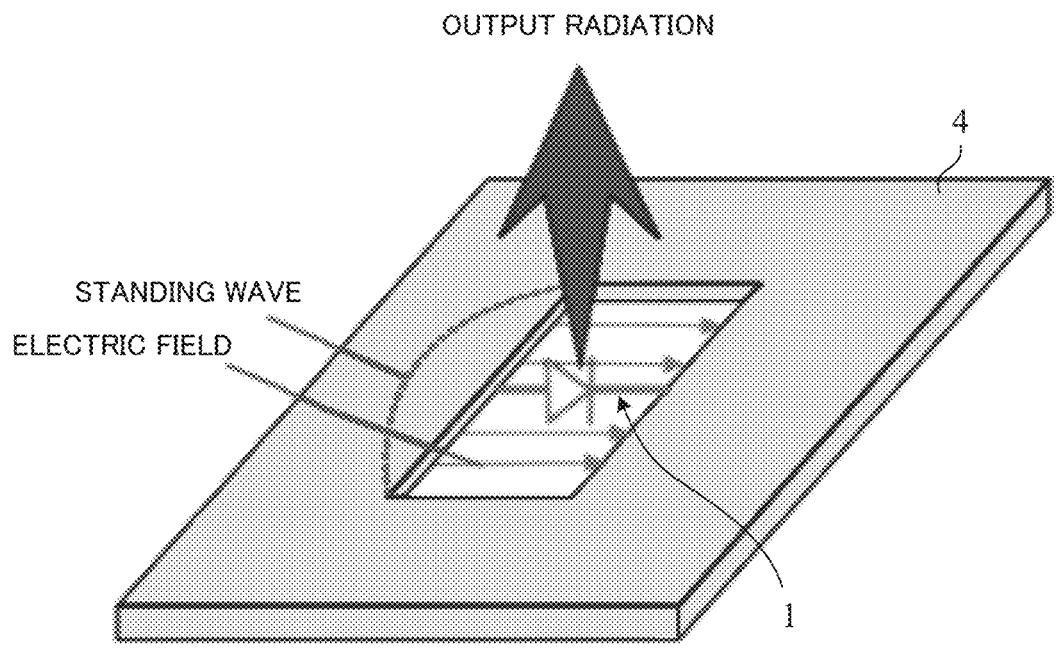
FIG. 2 is a schematic view showing an example of an output behavior of the conventional terahertz oscillator using the resonant tunneling diode.
Figure 3:
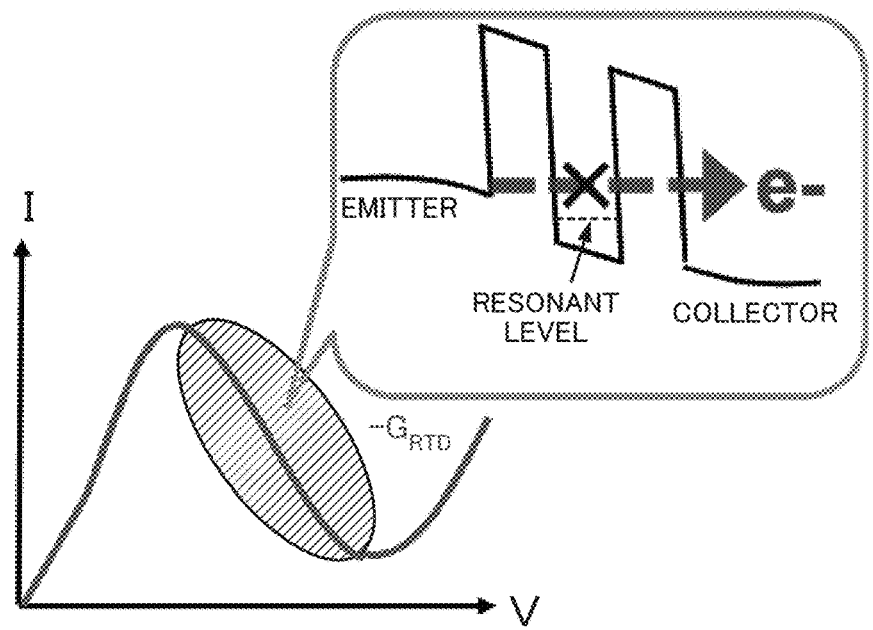
FIG. 3 is a characteristic diagram showing a characteristic example of the resonant tunneling diode.
Figure 4:
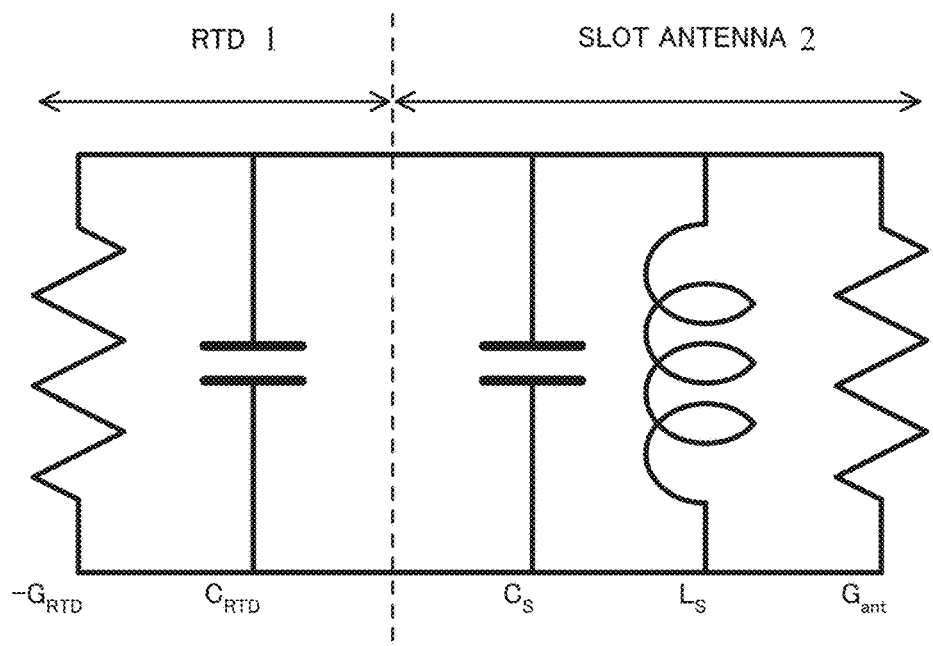
FIG. 4 is an equivalent circuit diagram of the conventional terahertz oscillator using the resonant tunneling diode.
Figure 5:
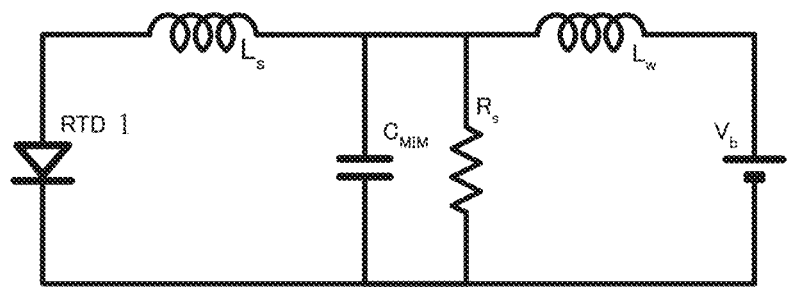
FIG. 5 is an equivalent circuit diagram of the conventional terahertz oscillator, including a bias circuit, using the resonant tunneling diode.
Figure 6A:
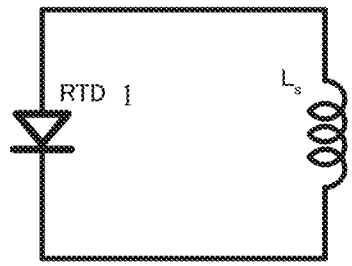
FIGS. 6A and 6B are equivalent circuit diagrams showing circuits of the high frequency and the low frequency, respectively.
Figure 6B:
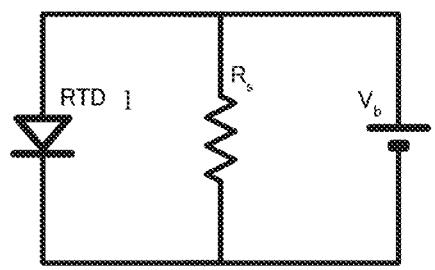
Figure 9A:
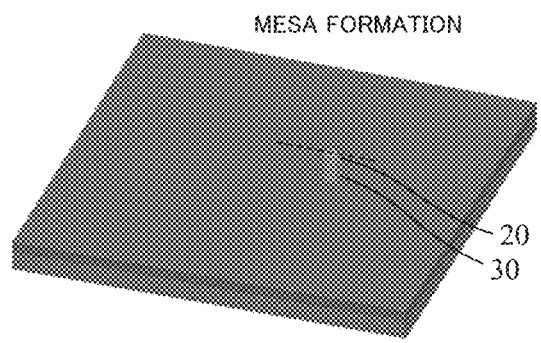
FIGS. 9A and 9B are a perspective diagram and a sectional structure diagram showing a part of the producing processes of the conventional terahertz oscillator using the resonant tunneling diode, respectively.
Figure 9B:
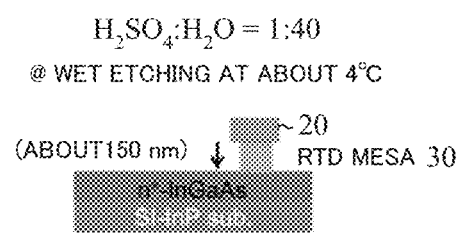
Figure 10A:
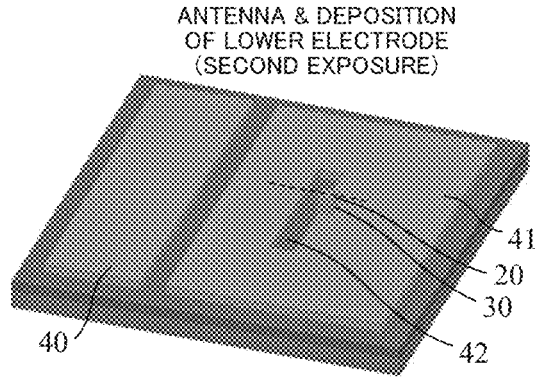
FIGS. 10A and 10B are a perspective diagram and a sectional structure diagram showing a part of the producing processes of the conventional terahertz oscillator using the resonant tunneling diode, respectively.
Figure 10B:
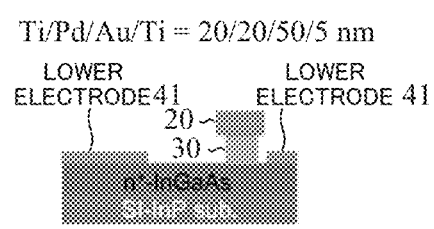
Figure 11A:
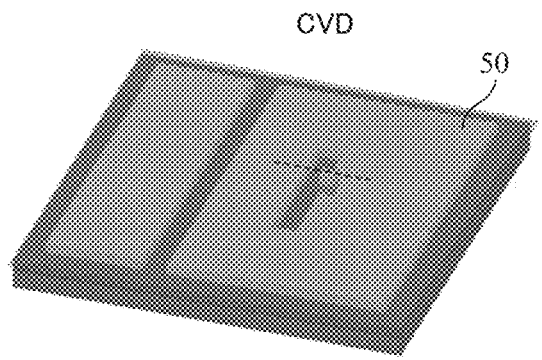
FIGS. 11A and 11B are a perspective diagram and a sectional structure diagram showing a part of the producing processes of the conventional terahertz oscillator using the resonant tunneling diode, respectively.
Figure 11B:
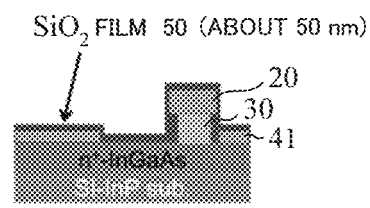
Figure 12A:
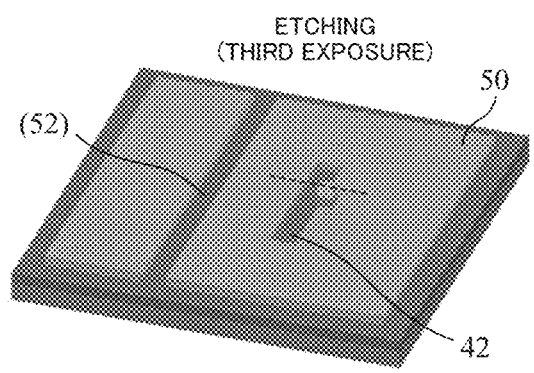
FIGS. 12A and 12B are a perspective diagram and a sectional structure diagram showing a part of the producing processes of the conventional terahertz oscillator using the resonant tunneling diode, respectively.
Figure 12B:
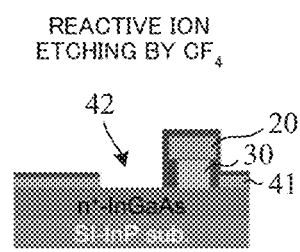
Figure 17:
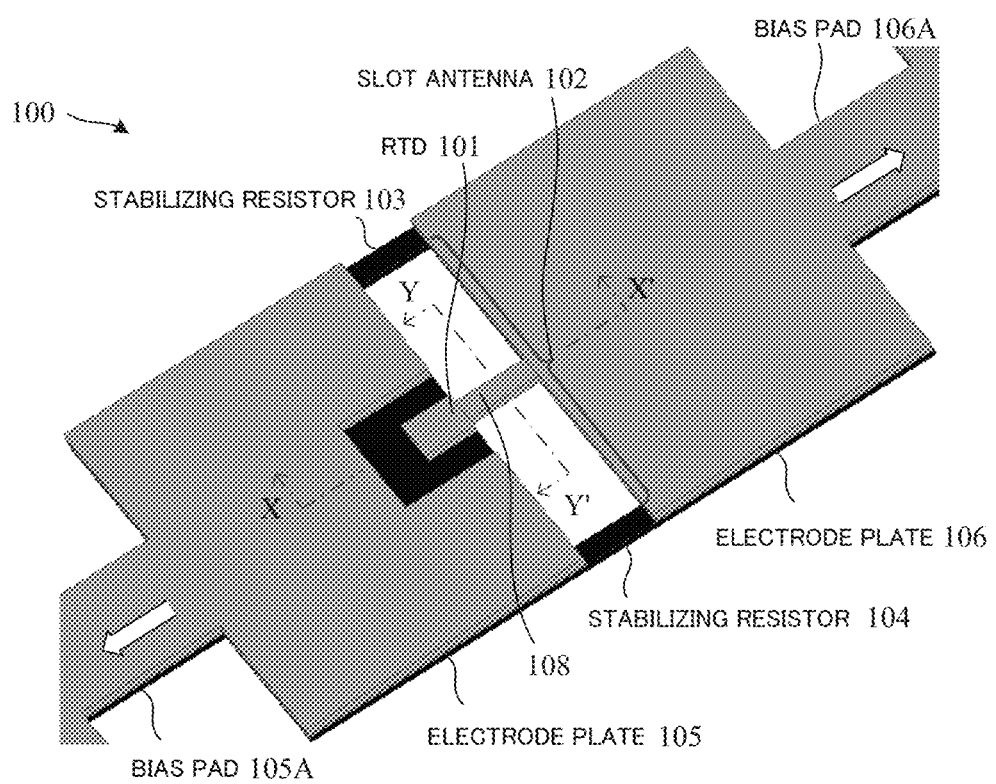
FIG. 17 is a perspective view showing a configuration example of a terahertz oscillator according to the present invention.
Figure 18:
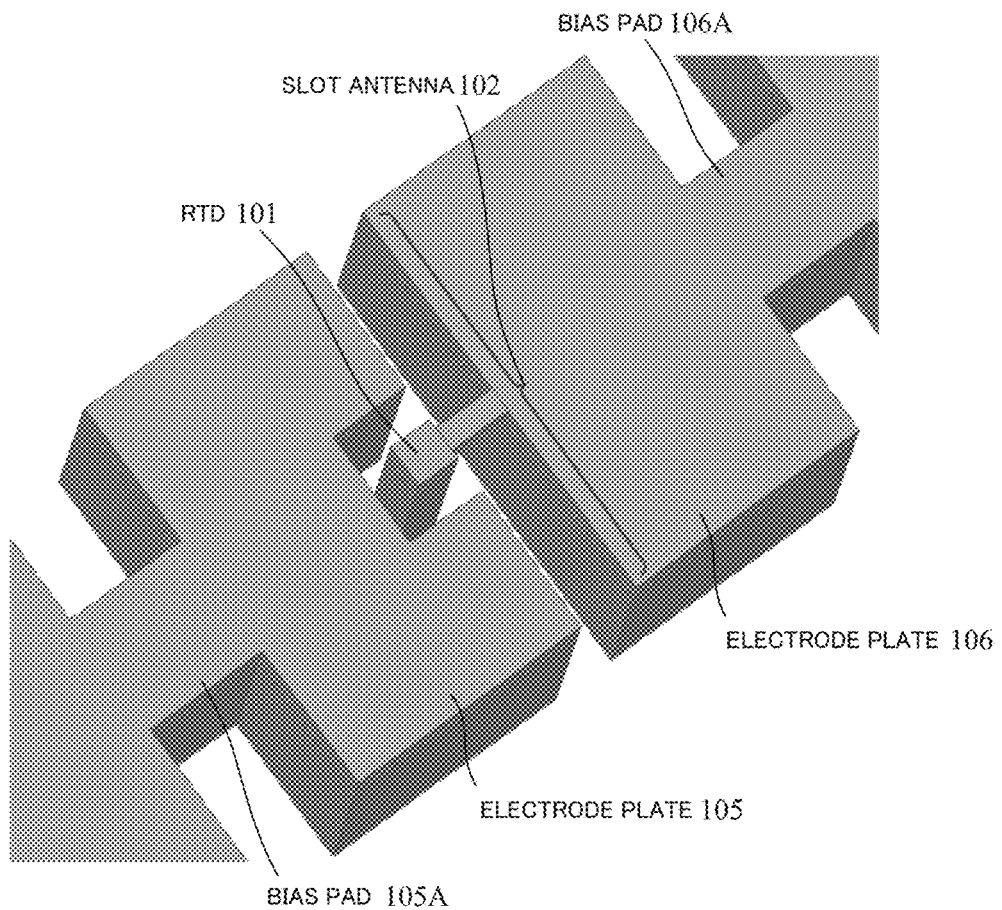
FIG. 18 is a three-dimensional perspective view showing a configuration example of the terahertz oscillator according to the present invention.
Figure 19:
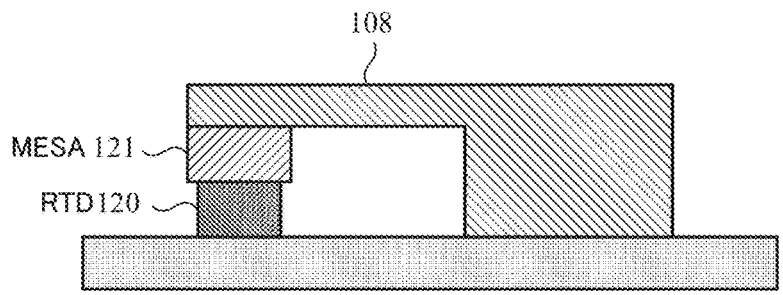
FIG. 19 is a cross-sectional view showing a cross-sectional structure example of the terahertz oscillator taken along an X-X' line in FIG. 17.
Figure 20:
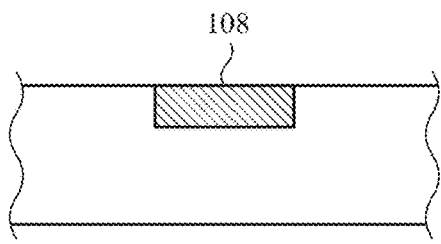
FIG. 20 is a cross-sectional view showing across-sectional structure example of the terahertz oscillator taken along a Y-Y' line in FIG. 17.
Figure 22:
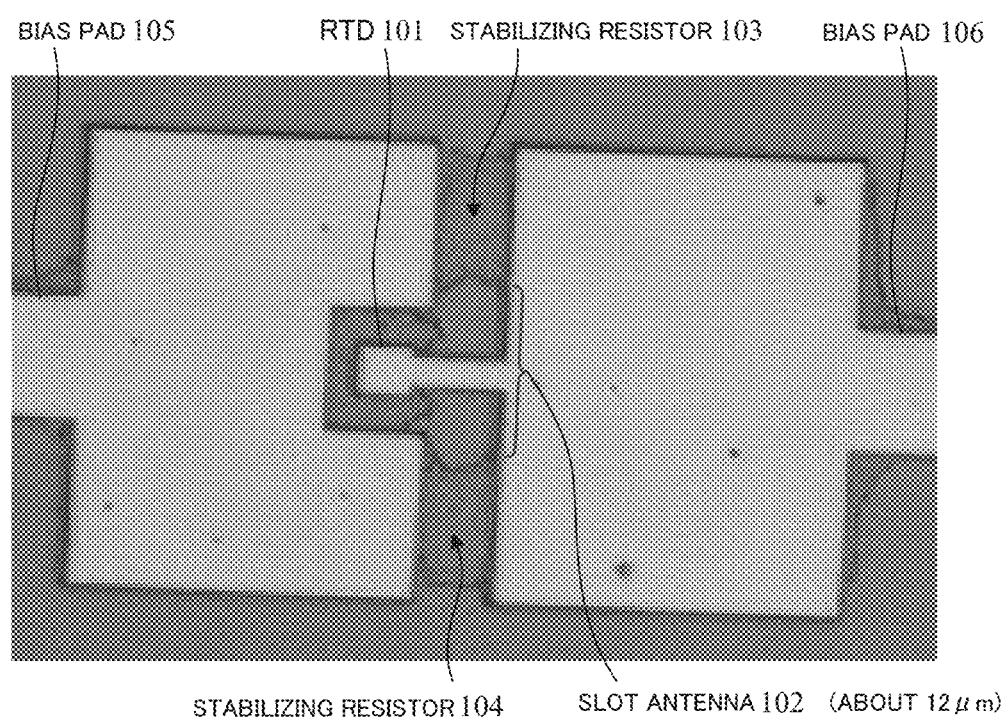
FIG. 22 is a plane view showing the produced terahertz oscillator according to the present invention.

FIG. 17 is a perspective view of a terahertz oscillator 100 according to the present invention, and FIG. 18 is a three-dimensional perspective structure view. Further, FIG. 19 is a cross-sectional structure view taken along an X-X' line in FIG. 17, FIG. 20 is a cross-sectional structure view taken along a Y-Y' line in FIG. 17 and FIG. 22 is a plane view showing the actually produced terahertz oscillator. An end surface of an electrode plate 105 facing to a slot portion surrounded by stabilizing resistors 103 and 104 is a slot antenna 102 (about 12 [μm]), and a rectangular conductive material member 108 is provided on a central portion of the slot antenna 102, An RTD 120 is connected to a tip portion of the conductive material member 108 through a mesa 121, and a portion below the conductive material member 108 is an air bridge structure to form the slot portion.

The terahertz oscillator 100 according to the present invention does not have the MIM capacitor structure, and comprises the electrode plate 105 which is connected to a bias pad 105A being grounded and a square shape electrode plate 106 which is connected to a bias pad 106A to apply a DC bias Vb. The slot is formed between the end surface of the electrode plate 105 and an opposite end surface of the electrode plate 106, and the end surface of the electrode plate 106 facing to the slot is the slot antenna 102. Further, the electrode plates 105 and 106 are respectively connected by the stabilizing resistors 103 and 104 of both sides. A square recess in a plane view is disposed on a portion opposite to the slot antenna 102 of the electrode plate 105, and a resonant tunneling diode (RTD) 101 is provided in the recess. The conductive material member 108 is suspended between the RTD 101 and the electrode plate 106, and the slot is the air bridge structure as shown in FIGS. 19 and 20.

The RTD 140 is a double barrier of, for example, AlAs/InGaAs, which may be constituted by the layers: an "n+InGaAs" layer ($5 \times 10^{19}$ [cm$^{-3}$], 100 [nm])/spacer an "InGaAs" layer (undoped, 12 [nm])/barrier an "AlAs" layer (undoped, 0.9 [nm])/well an "InGaAs" layer (undoped, 3 [nm])/barrier an "AlAs" layer (undoped, 0.9 [nm])/spacer an "InAlGaAs"

layer (undoped, 2 [nm])/an "n—InAlGaAs" layer (3×10$^{18}$ [cm$^{-3}$], 25 [nm])/an "n+InGaAs" layer (5×10$^{19}$ [cm$^{-3}$], 400 [nm]), from the top to the bottom.

Figure 21:
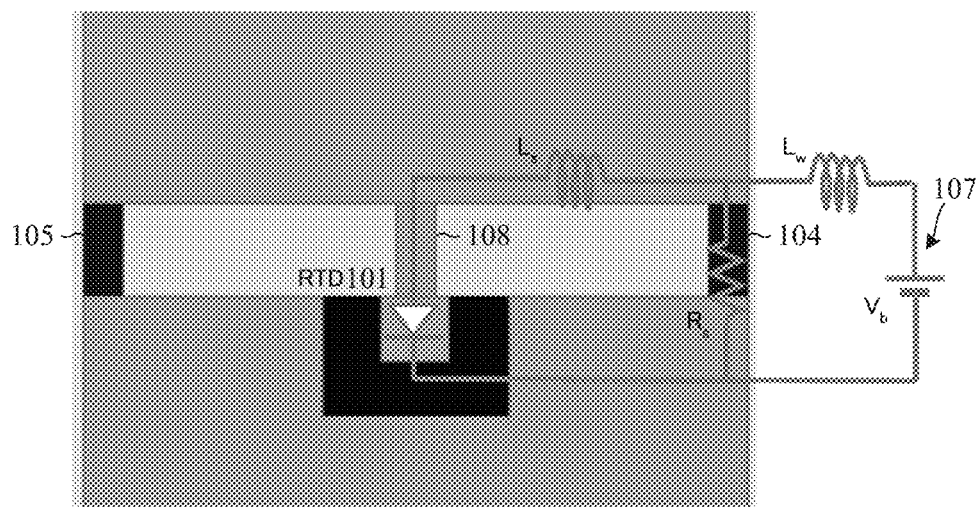
FIG. 21 is a plane structure view and an equivalent circuit diagram of the terahertz oscillator according to the present invention.

The equivalent circuit of the terahertz oscillator 100 is shown in FIG. 21. The bias voltage Vb from the bias circuit 107 is applied to the RTD 101 through an inductance $L_W$ of the lines and an inductance $L_S$ of the orbital current of the slot antenna 102, and the stabilizing resistors 103 and 104 (a total resistance value $R_S$) are connected to the RTD 101 in parallel. In the low frequency band, since the inductances $L_W$ and $L_S$ may be presumed as the short circuits and the resistance value $R_S$ of the stabilizing resistors 103 and 104 cancels the negative differential resistance (NDR) of the RTD 101, the equivalent circuit becomes FIG. 23A.

Figure 23A:
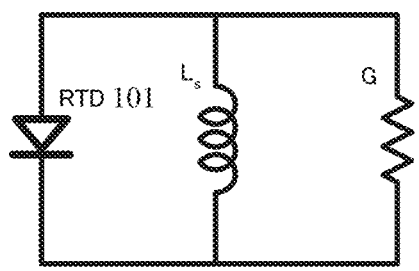
FIGS. 23A and 23B are equivalent circuit diagrams in the high frequency and the low frequency, respectively.
Figure 23B:
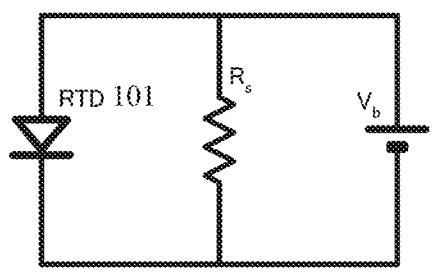

On the contrary, in the high frequency band as the terahertz, the impedance of the inductance $L_W$ becomes great and then the bias circuit is cut away, and further the equivalent circuit as shown in FIG. 23A is obtained by converting the series connected resistance R s and the inductance $L_S$ into the parallel connection. However, since the loss G of the resistance $R_S$ of the stabilizing resistors 103 and 104 becomes small, the resonance of the inductance $L_S$ and the capacitance in the RTD 101 is occurred and oscillates. That is, assuming that the oscillation frequency of the oscillator is "f", an angular frequency co is defined by "ω=2πf". The loss G of the resistance $R_S$ is expressed by a following Expression 3.

$$G = \frac{R_s}{R_s^2 + \omega^2 L_S^2} \quad [\text{Expression 3}]$$

Since the resistance value $R_S$ is a small value (few Ω), "$R_S^2$" in the Expression 3 becomes almost zero. Accordingly, the Expression 3 can be approximated by a following Expression 4.

$$G \approx \frac{R_s}{\omega^2 L_S^2} \quad [\text{Expression 4}]$$

In the above Expression 4, since a square "ω$^2$" of the angular frequency ω is a great value in the terahertz frequency, the Expression 4 becomes almost zero and the loss G of the resistance $R_S$ can be ignored. In this connection, the resonance of the inductance $L_S$ and the capacitance in the RTD 101 is occurred and oscillates.

Figure 24:
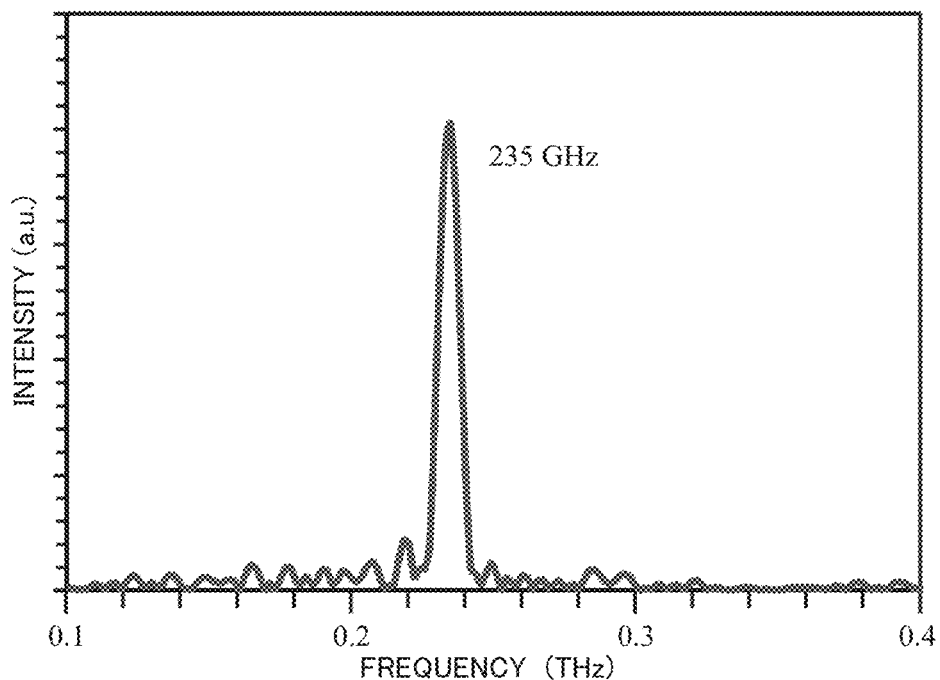
FIG. 24 is a characteristic diagram showing an oscillation result of the terahertz oscillator according to the present invention.

FIG. 24 shows an oscillation characteristic (frequency/intensity) of a prototype product (FIG. 22) according to the present invention, and the oscillation of about 0.2 [THz] is obtained.

FIGS. 25A to 25F show the producing processes of the terahertz oscillator 100 according to the present invention.

First, the substrate structure 110 comprising four layers which are the resonant tunneling diode (RTD) layer 114 of the top, the etch stopper layer (n$^+$-InP) 113, the n$^+$-InGaAs layer 112 and the Sl-InP substrate 111 of the bottom, is prepared as shown in FIG. 25A. Then, the upper electrode 121 is formed on the RTD portion on the RTD layer 114 by the resist patterning with the exposure and the deposition, and the RTD mesa 120 is formed by removing a part of the RTD layer 114 with the wet etching as shown in FIG. 25B. At a time of the RTD mesa formation with the wet etching, a side etch proceeds for the RTD mesa 120 existing under the conductive material member 121 as shown in FIG. 26. That is, although the size of the RTD 120 immediately after the wet etching is started is a distance d1 from an end surface of the mesa 121 as shown in FIG. 26A, all of the RTD 120 existing under the portion 108 in which the conductive material member is thin is finally removed as shown in FIG. 26B when the wet etching further is continued. Thereby, the air bridge is formed, and the size of the RTD 120 becomes a distance d2 (>d1) from the end surface of the mesa 121.

Since the size of the RTD 120 influences to the inner capacitance, the wet etching may be stopped when the air bridge is formed. On the contrary, by continuing the wet etching, the size of the RTD 120 may allow to be smaller. The width of the portion 108 in which the conductive material member is thin, is double of the distance d2 or less.

Next, the etch stopper of the etch stopper layer 113 is removed by the wet etching. Then, the photo resist 130 is layered on the whole surface as shown in FIG. 25D, and the resist pattern to protect the portions becoming to the electrode portion and the stabilizing resistors 104 and 105 except for the air bridge is formed by the exposure with the photomask. Further, the n$^+$-InGaAs layer 112 is removed by the wet etching as shown in FIG. 25E. By removing the photo resist 130, the terahertz oscillator to oscillate due to the resonance of the RTD 120 and the stabilizing resistors 104 and 105 is produced as shown in FIG. 25F.

INDUSTRIAL APPLICABILITY

By using the minute devices according to the present invention, a compact chip, which measures absorption spectra of a material whose absorption spectra are existed in the terahertz frequency band and a light source chip for the terahertz imaging, can be easily produced. It is considered that the terahertz oscillator according to the present invention enables to facilitate a further development in the fields such as the chemistry, the medical regions and the security. Further, the terahertz oscillator according to the present invention has extensibility to large scale array as shown in FIGS. 27A and 27B, and FIG. 27A shows an example of a case having oscillating element spacing and FIG. 27B does an example of the high-density array.

EXPLANATION OF REFERENCE NUMERALS

1 resonant tunneling diode (RTD)
2 slot antenna
3 substrate
4, 41 lower electrode
40 upper electrode
7 MIM
10 wafer
20 mesa
30 RTD
100 terahertz oscillator
101 resonant tunneling diode (RTD)
102 slot antenna
103, 104 stabilizing resistor
108 conductive material member
110 substrate structure
120 RTD mesa
121 mesa
130 photoresist

The invention claimed is:
1. A terahertz oscillator comprising:
   a slot antenna having a slot formed between a first electrode plate and a second electrode plate which are applied a bias voltage;

stabilizing resistors to respectively connect to said first electrode plate and said second electrode plate are provided in the slot;

a resonant tunneling diode (RTD) provided on said second electrode plate through a mesa; and a conductive material member to form an air bridge between said first electrode plate and said mesa is provided, wherein an oscillation in a terahertz frequency band is obtained due to a resonance of said RTD and said stabilizing resistors, and wherein a width of said conductive material member is narrower than a width of said RTD for said slot antenna.

2. The terahertz oscillator according to claim 1, wherein said stabilizing resistors are two stabilizing resistors that are symmetrically connected to said slot antenna.

3. The terahertz oscillator according to claim 1, wherein said RTD is provided on an $n^+$-InP etch stopper of said first electrode plate.

4. The terahertz oscillator according to claim 2, wherein said RTD is provided on an $n^+$-InP etch stopper of said first electrode plate.

5. A producing method of a terahertz oscillator, the producing method comprising steps of:

preparing a substrate structure having four layers including a resonant tunneling diode (RTD) layer as a top layer, an etch stopper layer as a next layer and an $n^+$-InGaAs layer;

forming a mesa at an RTD portion on the RTD layer by a first exposure;

forming an RTD by removing the RTD layer by a first wet etching;

forming an air bridge and stabilizing resistors by removing an etch stopper of the etch stopper layer by a second wet etching;

layering photoresist on a whole surface;

forming a slot antenna by performing a second exposure by using a photomask;

removing the photoresist and the $n^+$-InGaAs layer by a third wet etching; and producing a terahertz oscillator to oscillate due to a resonance of the RTD and the stabilizing resistors, wherein the first wet etching and the third wet etching are respectively "$H_2SO_4:H_2O_2:H_2O=1:1:40$" at 4 degrees Celsius.

6. A producing method of a terahertz oscillator, the producing method comprising steps of:

preparing a substrate structure having four layers including a resonant tunneling diode (RTD) layer as a top layer, an etch stopper layer as a next layer and an $n^+$-InGaAs layer;

forming a mesa at an RTD portion on the RTD layer by a first exposure;

forming an RTD by removing the RTD layer by a first wet etching;

forming an air bridge and stabilizing resistors by removing an etch stopper of the etch stopper layer by a second wet etching;

layering photoresist on a whole surface;

forming a slot antenna by performing a second exposure by using a photomask;

removing the photoresist and the $n^+$-InGaAs layer by a third wet etching; and producing a terahertz oscillator to oscillate due to a resonance of the RTD and the stabilizing resistors, wherein the second wet etching is "$HCl:H_2O=1:5$" at 4 degrees Celsius.

7. The producing method of the terahertz oscillator according to claim 5, wherein the second wet etching is "$HCl:H_2O=1:5$" at 4 degrees Celsius.

8. The producing method of the terahertz oscillator according to claim 5, wherein when the air bridge is formed by the second wet etching, said removing of the etch stopper is completed.

9. The producing method of the terahertz oscillator according to claim 6, wherein when the air bridge is formed by the second wet etching, said removing of the etch stopper is completed.

10. The producing method of the terahertz oscillator according to claim 7, wherein when the air bridge is formed by the second wet etching, said removing of the etch stopper is completed.

* * * * *